(12) United States Patent
Borst

(10) Patent No.: US 7,731,508 B2
(45) Date of Patent: Jun. 8, 2010

(54) ADAPTER BOARD, SOCKET, AND DEVICE FOR CONNECTING AN ELECTRONIC CONTROLLER TO THE CONNECTION LEADS THEREOF

(75) Inventor: Joachim Borst, Donaueschingen (DE)

(73) Assignee: MC Technology GmbH, Blumberg (DE)

( * ) Notice: Subject to any disclaimer, the term of this patent is extended or adjusted under 35 U.S.C. 154(b) by 0 days.

(21) Appl. No.: 12/222,110

(22) Filed: Aug. 1, 2008

(65) Prior Publication Data

US 2009/0042446 A1    Feb. 12, 2009

(30) Foreign Application Priority Data

Aug. 9, 2007    (DE) .................... 20 2007 011 112 U

(51) Int. Cl.
*H01R 12/00*    (2006.01)
(52) U.S. Cl. ...................................... 439/76.1; 439/638
(58) Field of Classification Search ................ 439/76.1, 439/638, 709, 715, 716
See application file for complete search history.

(56) References Cited

U.S. PATENT DOCUMENTS 6,802,737 B2 * 10/2004 Bergner et al. ............... 439/532
6,811,412 B2 * 11/2004 Uezono ...................... 439/76.2

FOREIGN PATENT DOCUMENTS

| DE | 44 38 804 C1 | 3/1996 |
| DE | 195 15 923 A1 | 11/1996 |
| DE | 299 01 194 U1 | 7/1999 |
| GB | 2 035 716 A | 6/1980 |

\* cited by examiner

*Primary Examiner*—Khiem Nguyen
(74) *Attorney, Agent, or Firm*—The Nath Law Group; Jerald L. Meyer; Jiaxiao Zhang

(57) ABSTRACT

An adapter board for connecting an electronic controller to the connection leads thereof includes a printed circuit board having at least two pins, which can be inserted into connections for the connection leads of the electronic controller. The adapter board also includes a plug-in connector, which can be plugged into a mating plug-in connector of a socket and which can be brought into a signal connection with the connection leads. The pins are connected to the plug-in connector in an electrically conductive manner via the printed circuit board.

5 Claims, 3 Drawing Sheets

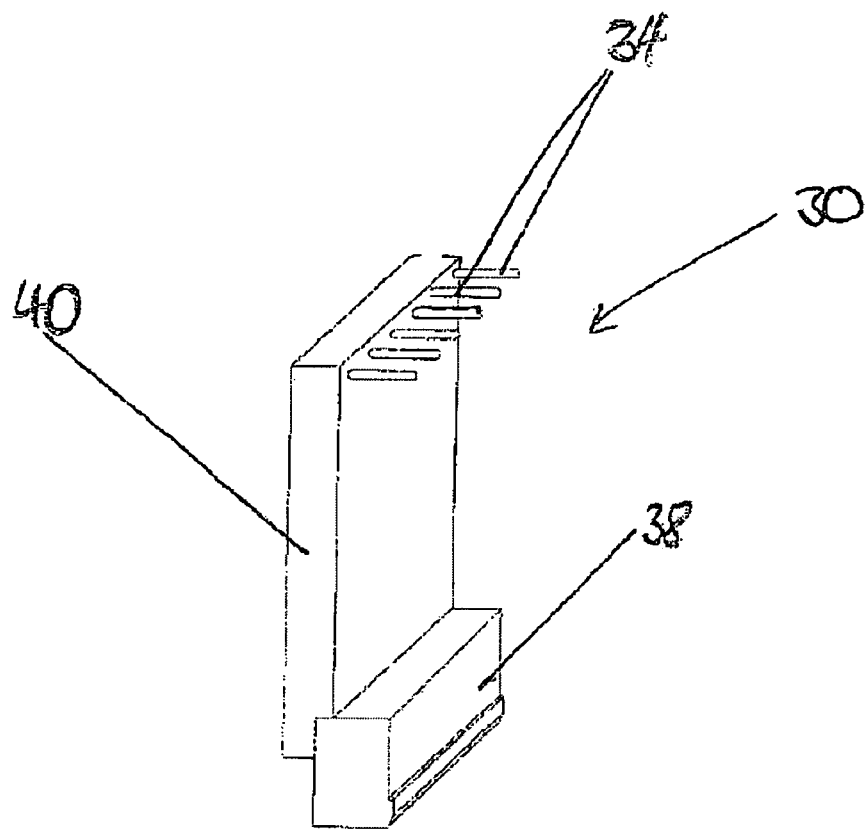

ADAPTER BOARD, SOCKET, AND DEVICE FOR CONNECTING AN ELECTRONIC CONTROLLER TO THE CONNECTION LEADS THEREOF

The invention relates to an adapter board, a socket, and a device for connecting an electronic controller to the connection leads thereof.

Figure 1:
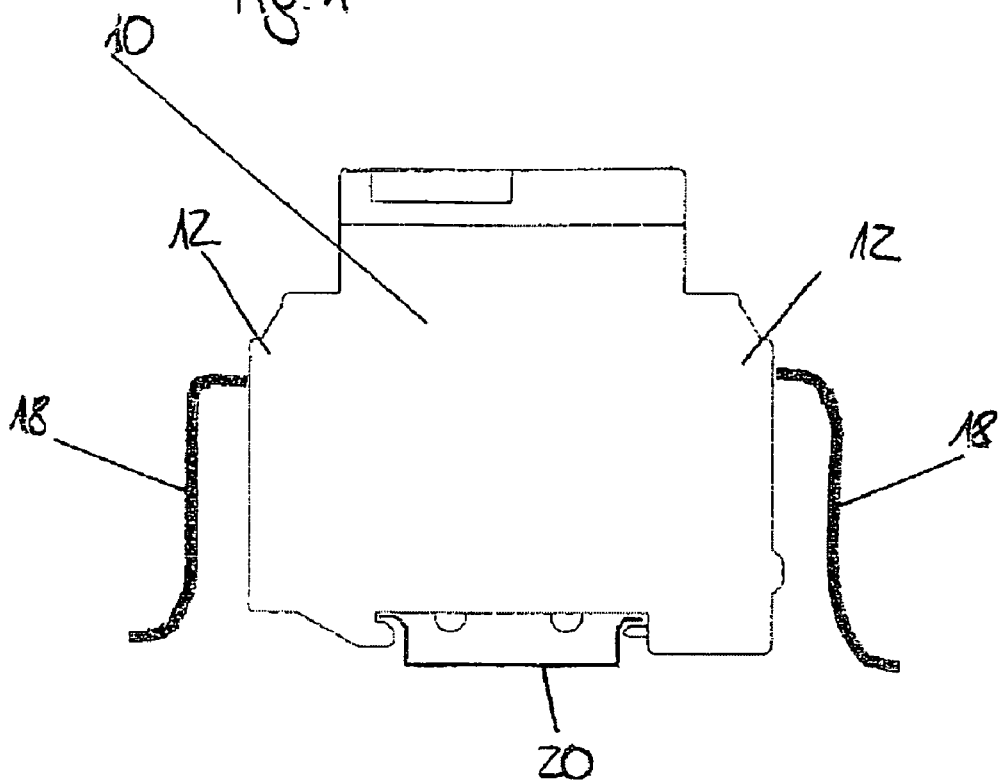

Electronic controllers, or input/output modules, by means of which, for example, various building components, such as doors, shutters, heaters, or air conditioners, can be controlled, often have connections for connecting external sensors, actuators, or other connection leads. Thus, such controllers are configured particularly for connecting individual connection leads. Depending on the embodiment of the controller, 4 to 32, or even significantly more connection leads, such as, for example, 100 or 200 connection leads, can end at a single controller. Each of these individual connection leads must be attached separately to the connection provided, for example, to a terminal. Such a controller 10 according to prior art is also shown in FIG. 1, wherein the electronic controller 10 is placed onto a top hat rail 20 and comprises terminals 12, in which connection leads 18 are fastened.

When such a controller needs to be exchanged, either because it is defective, or because it requires maintenance, or it is to be replaced with a new device, all of the connection leads must be removed separately, and after maintenance or replacement of the new device, must be reconnected to the proper terminals. The risk of confusion is very high with such replacement such that error functions may be present after replacement due to interchanged connection leads. The greatest disadvantage is, however, that the connecting and reconnecting of the plurality of connection leads is extremely time-consuming, wherein the controller must be deactivated during the work performed on the controller, thus posing a risk to the user. However, such downtimes, which may last several hours up to several days depending on the size or amount of controllers, are unacceptable during an operating mode.

It is the aim of the invention to enable a retrofit connection the connection leads of a standard electronic controller, wherein the connection leads facilitate the efficient replacement of a controller.

The aim of the invention is achieved by means of an adapter board having the characteristics of claim 1, a socket having the characteristics of claim 6, and a device for connecting an electronic controller to the connection leads thereof according to claim 8.

Advantageous embodiments and further developments of the invention are stated in the sub-claims.

The adapter board for connecting an electronic controller to the connection leads thereof according to the invention has a printed circuit board, comprising at least two pins, and a plug-in connector. The pins can be inserted into the connections for the connection leads of the electronic controller, while the plug-in connector can be plugged into a mating plug-in connector of a socket, which can be brought into a signal connection to the connection leads. The pins are connected to the plug-in connector in an electrically conductive manner via the printed circuit board. The essential concept of the invention is to equip the electronic controller such that it becomes pluggable so that a quick exchange is facilitated by means of a simple disconnecting of the plug-in connection from the mating plug-in connection, without having to disconnect all of the connection leads, and reconnecting the same again for the purpose of replacement. Due to the fact that the connection leads are not connected directly in the controller, but in a socket, and due to the fact that the pins of the adapter board are now inserted into the connections of the electronic controller, to which the connection leads are connected directly according to prior art, the controller is equipped such that merely the plug-in connector needs to be disconnected from the mating plug-in connector of the socket for the replacement of the controller, and subsequently a new device can be inserted into the socket via the plug-in connector in an extremely short amount of time. The replacement time for the electronic controller, during which the controller must be put out of operation, is thus merely a fraction of the replacement time required according to prior art in order to disconnect all connection leads from the controller, and reconnect the same after the maintenance of the device, or to a new device.

Preferably, the pins are arranged substantially perpendicular to the printed circuit board so that the printed circuit board extends substantially parallel to the exterior of the housing of the electronic controller, thus not substantially enlarging the outer dimensions of the electronic controller.

In a particularly preferred embodiment of the invention the pins are arranged on a multi-pin connector, preferably a soldered multi-pin connector, so that their relative length to each other is fixed, and the pins are also produced in an easy and cost-effective manner.

In a particularly preferred manner the plug-in connector has a plug-in direction that extends parallel to the surface of the printed circuit board, since this controller therefore comprises the plug-in connector substantially within the region of the base board of the housing with the attachment of the adapter board substantially parallel to the exterior of the housing of the electronic controller, so that the electronic controller can therefore be inserted onto the respective mating plug-in connector substantially perpendicular from the top.

In a particularly preferred manner the adapter board comprises a protective housing that is embodied particularly in an insulating manner so that it forms a protection from contacting of the conductive parts, particularly of the tracks of the printed circuit board, and the contacts between the pins and the tracks, and between the tracks and the plug-in connector.

The socket according to the invention for connecting an electronic controller to the connection leads thereof comprises a mating plug-in connector on one hand, into which the electronic controller can be plugged via a plug-in connector, and has connections for the connection leads of the electronic controller on the other hand such that the connection leads are not directly connected to the electronic controller, but in the socket, instead. The connections are in an electrically conductive connection to the mating plug-in connector. Therefore, when the electronic controller has to be replaced, the connection leads do not need to be disconnected from the electronic controller, and reconnected to the controller after maintenance or replacement of the device, but the connection between the plug-in connector and the mating plug-in connector merely needs to be disconnected in order to facilitate a simple, secure, and particularly quick replacement of the electronic controller. For this purpose the plug-in connector can be arranged directly on the controller, or on the housing thereof, respectively, or may also be arranged on the controller via the adapter board according to the invention.

Preferably, the socket can be mounted on a top hat rail. According to prior art, the electronic controller is usually mounted directly onto the top hat rail so that a substantially compact construction is enabled by means of the mounting of the socket according to the invention onto the top hat rail, and thus by means of the possibility to plug the electronic controller into the socket.

The device according to the invention for connecting an electronic controller to the connection leads thereof comprises an adapter board according to the invention and a socket according to the invention in order to enable overall a retrofitting of the known electronic controller such that a quick replacement of the electronic controller is facilitated.

The invention is explained in further detail below based on the following figures.

Figure 2:
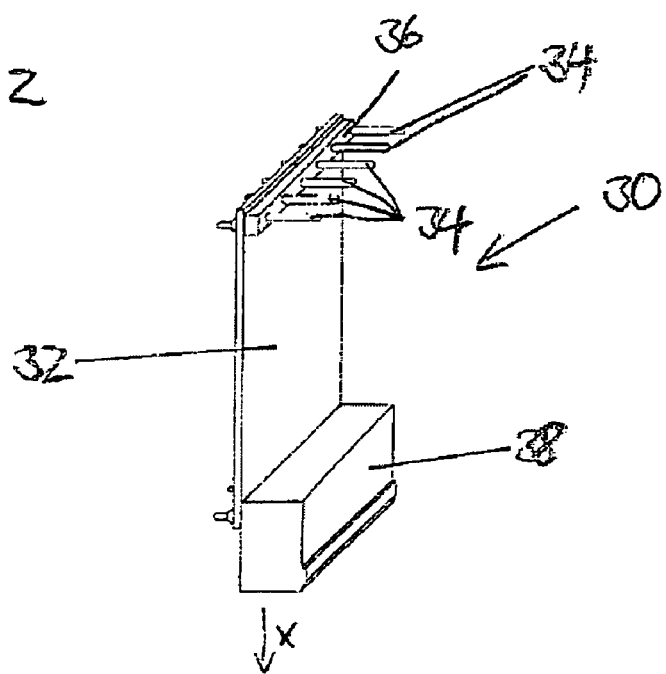
Figure 3:
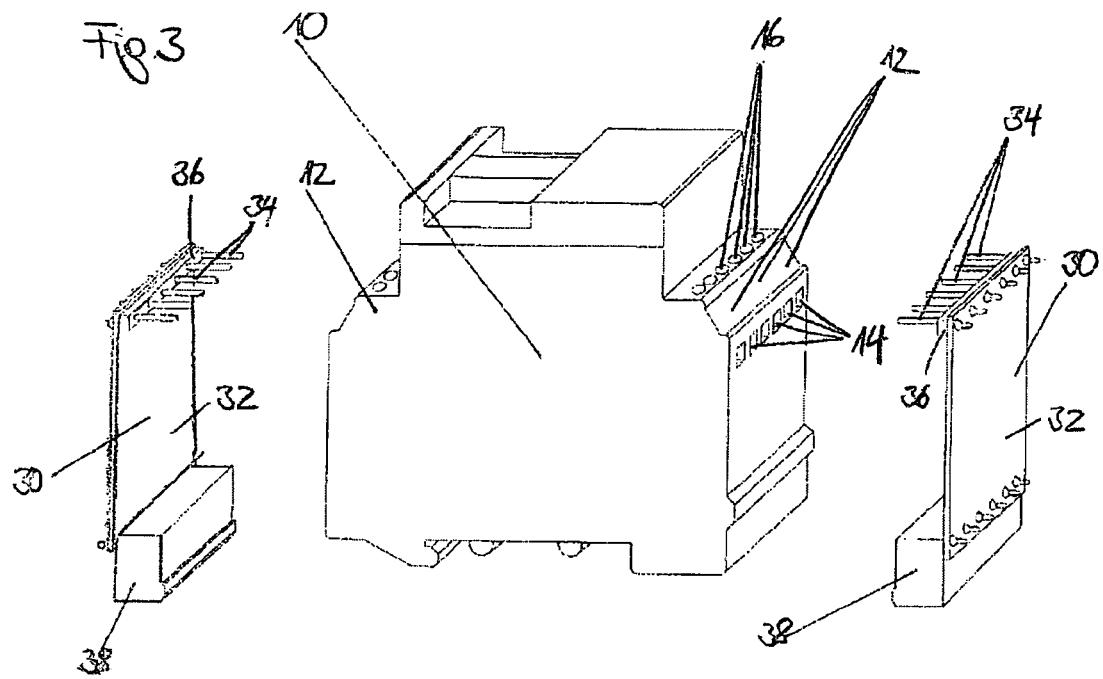
Figure 4:
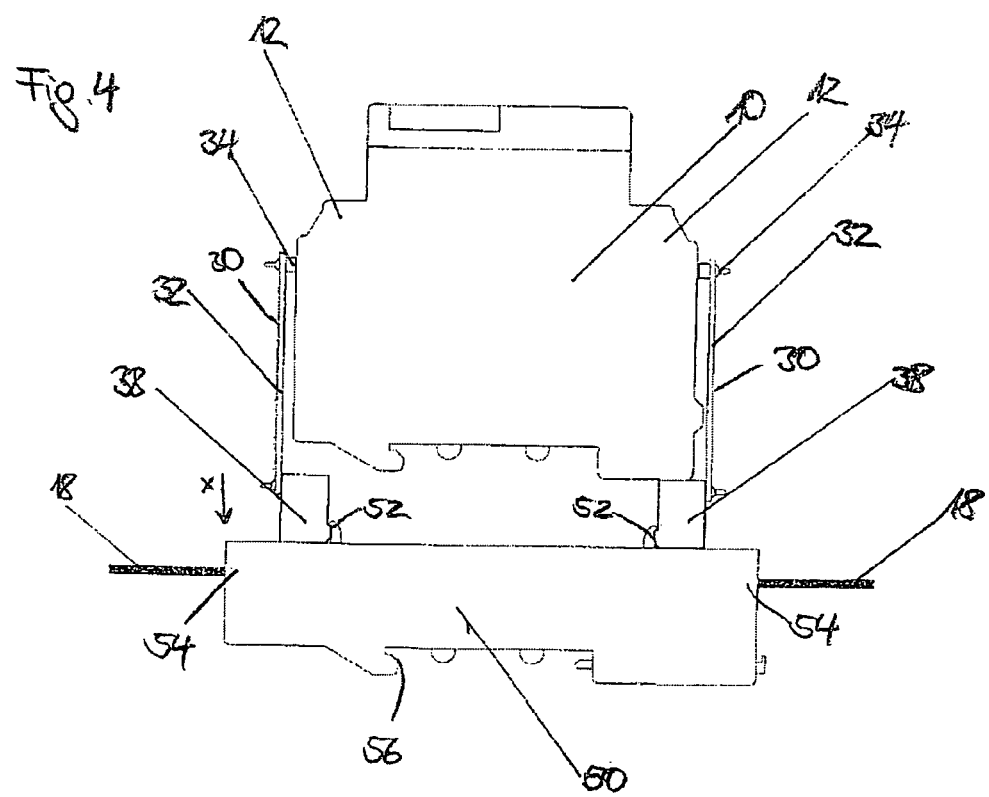

They show:

FIG. 1 a schematic illustration of a controller according to prior art,

FIG. 2 a perspective illustration of an adapter board according to the invention, FIG. 3 a perspective illustration of an electronic controller according to prior art, which is equipped with two adapter boards according to the invention as shown in FIG. 2, FIG. 4 a side view of the device according to the invention for connecting an electronic controller to the connection leads thereof, and FIG. 5 a further exemplary embodiment of an adapter board according to the invention.

Equal parts in the figures are denoted by equal reference symbols.

FIG. 2 illustrates a perspective view of an adapter board 30 comprising a substantially rectangular printed circuit board 32, on the one longitudinal edge of which a multi-pin connector 36 is arranged, having multiple pins 34 extending parallel to each other. The pins 34 are positioned substantially perpendicular to the printed circuit board 32, and are connected to tracks (not illustrated) of the printed circuit board 32 that are produced via the through-hole method. A plug-in connector 38 is arranged on the opposite longitudinal edge of the printed circuit board 32, wherein each of the pins 34 is connected to a respective contact of the plug-in connector 38 in an electrically conductive manner via the tracks of the printed circuit board 32.

FIG. 5 illustrates an alternative embodiment of the adapter board 30, which only differs from the adapter board illustrated in FIG. 2 in that a protective housing 40 is arranged via the printed circuit board 32, which covers the contact points between the pins 34 and the printed circuit board 32, or the plug-in connector 38, respectively, and the printed circuit board 32 such that a protection is provided from contacting electrically conductive parts.

FIG. 3 illustrates the retrofitting of the electronic controller 10 according to prior art with two adapter boards according to the invention as shown in FIG. 2. The controller 10 comprises multiple connection terminals 12, which are arranged parallel next to each other in two opposite rows, thus resulting in one row each of insertion slots 14 on two sides of the housing of the electronic controller 10, into which the connection leads 18 according to prior art are inserted as illustrated in FIG. 1, and are clamped down by means of clamping screws 16. According to the invention, instead of the connection leads 18, the pins 34 of the adapter board 30 are now inserted into the insertion slots 14 of the connection terminals 12 of the electronic controller 10, and the pins 34 are fixed in the connection terminals 12 via the clamping screws 16. Preferably, the number of pins 34 of one of the printed circuit boards 32 corresponds to the number of insertion slots 14 on the side of the housing of the electronic controller 10.

The length of the printed circuit board 32 of the adapter board 30 is dimensioned such that the printed circuit boards 32 extend substantially parallel along the side surfaces of the housing of the controller 10, and that the plug-in connectors 13 come to rest underneath the base board of the housing of the controller 10. This facilitates the plugging in of the controller 10 that is retrofitted with the two adapter boards 30 into the socket 50 in the plug-in direction x.

As illustrated in FIG. 4, the controller 10 having the two adapter boards 30 is plugged into a socket 50 via the two plug-in connectors 38 such that the plug-in connector 38 comes into contact with two mating plug-in connectors 52 arranged on the socket 50. In this manner an electrically conductive connection is made between the plug-in connectors 38 and the socket 50, and thus between the socket 50 and the connection terminals 12 of the controller 10.

The socket 50 in turn comprises connections 54, which are not illustrated in detail, for the connection leads 18 of the electronic controller 10, wherein, for example, the connections 54 may be substantially identical to the connection terminals 12 of the electric controller 10. Particularly, the socket 50 has such a number of connections 54 so that each of the connection leads 18, which would otherwise be connected to one of the connection terminals 12 of the electric controller 10, can be connected to the socket 50. An electrically conductive connection is present between the connections 54 for the connection leads 18 and the mating plug-in connector 52 in the socket 50. Thus, an electrically conductive connection of each individual connection lead 18 is thus created via the adapter board 30 and the socket 50 by means of the connection between the mating plug-in connector 52 and the plug-in connection 38 via the tracks of the printed circuit board 32 and the pins 34 having the connection terminal 12 of the electric controller 10 that is associated with the respective connection lead 18. The socket 50 can be particularly mounted onto the top hat rail 20 via a contact 56.

If a system according to prior art as illustrated in FIG. 1 has been retrofitted such that it becomes a system as illustrated in FIG. 4, a subsequent replacement of the electronic controller 10 can be carried out in a conceivably easy manner, and particularly quickly, in that only the connection between the two plug-in connectors 38 and the mating plug-in connectors 52 of the socket 50 need to be disconnected, and another device equipped with two adapter boards 30 accordingly can be replaced onto the socket 50. Should the newly inserted electronic controller 10 not be operational immediately, it may be disconnected in a short amount of time, and replaced by the previously still functioning controller 10, in order to subsequently perform maintenance on the defective controller 10 during the operation mode. The wiring of the connection leads 18 remains untouched with the replacement of the electronic controller 10 such that neither an unintentional confusion of two connection leads 17 may occur, nor a great amount of time is required by disconnecting and reconnecting each individual connection lead 18.

LIST OF REFERENCE SYMBOLS 10 controller
12 connection terminal
14 insertion slot
16 clamping screw
18 connection lead
20 top hat rail
30 adapter board
32 printed circuit board
34 pin
36 pin rail
38 plug-in connector
40 protective housing
50 socket
52 mating plug-in connector
54 connection
56 contact
x plug-in direction

The invention claimed is:

1. An adapter board (30) for connecting an electronic controller (10) to the connection leads (18) thereof, wherein the adapter board (30) comprises a printed circuit board (32) having at least two pins (34), which can be inserted into connections (12) for the connection leads (18) of the electronic controller (10), and a plug-in connector (38), which can be plugged into a mating plug-in connector (52) of a socket (50), which can be brought into a signal connection with the connection leads (18), wherein the pins (34) are connected to the plug-in connector (18) in an electrically conductive manner via the printed circuit board (32).

2. The adapter board according to claim 1, characterized in that the pins (34) are arranged perpendicular to the printed circuit board (32).

3. The adapter board according to claim 1, characterized in that the pins (34) are arranged in a multi-pin connector (36), preferably a soldered multi-pin connector (36).

4. The adapter board according to claim 1, characterized in that the plug-in connector (38) comprises a plug-in direction (x) that extends parallel to the surface of the printed circuit board (32).

5. The adapter board according to claim 1, characterized in that the adapter board (30) comprises a protective housing (40).

* * * * *